US012574019B2

(12) United States Patent
Jeong et al.

(10) Patent No.: US 12,574,019 B2
(45) Date of Patent: Mar. 10, 2026

(54) FREQUENCY MULTIPLIER BASED ON RING OSCILLATOR USING POWER GATING INJECTION LOCKING

(71) Applicant: SAMSUNG ELECTRONICS CO., LTD., Suwon-si (KR)

(72) Inventors: Chanyoung Jeong, Suwon-si (KR); Jaehyouk Choi, Daejeon (KR); Junhyeok Yang, Suwon-si (KR); Suneui Park, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 4 days.

(21) Appl. No.: 18/431,449

(22) Filed: Feb. 2, 2024

(65) Prior Publication Data

US 2024/0267037 A1     Aug. 8, 2024

(30) Foreign Application Priority Data

Feb. 2, 2023     (KR) ........................ 10-2023-0014456
May 11, 2023     (KR) ........................ 10-2023-0061262

(51) Int. Cl.
  *H03K 5/00*          (2006.01)
  *H03K 3/03*          (2006.01)
              (Continued)
(52) U.S. Cl.
  CPC ....... *H03K 5/00006* (2013.01); *H03K 3/0315* (2013.01); *H03K 5/14* (2013.01); *H03K 2005/00078* (2013.01); *H03K 19/20* (2013.01)

(58) Field of Classification Search
  CPC ......... H03L 7/0995; H03L 7/099; H03L 7/16; H03L 7/22; H03K 3/0315; H03K 3/03; H03K 3/027; H03K 3/02; H03K 5/00006
  See application file for complete search history.

(56) References Cited

U.S. PATENT DOCUMENTS 6,104,326 A     8/2000  Lee et al.
8,941,420 B2    1/2015  Zerbe et al.
              (Continued)

FOREIGN PATENT DOCUMENTS

JP          6195800 B2      9/2017
JP          2020-36203 A    3/2020

OTHER PUBLICATIONS

Lechang Liu et al., "315MHz energy-efficient injection-locked OOK transmitter and 8.4µW power-gated receiver front-end for wireless ad hoc network in 40nm CMOS", 2011 Symposium on VLSI Circuits—Digest of Technical Papers, pp. 164-165.
              (Continued)

*Primary Examiner* — Diana J. Cheng
(74) *Attorney, Agent, or Firm* — Sughrue Mion, PLLC

(57)          ABSTRACT

A frequency multiplier includes a first ring oscillator, a second ring oscillator that is turned on complementarily to the first ring oscillator, a combining circuit that combines a first output signal of the first ring oscillator and a second output signal of the second ring oscillator to generate a final output signal, and a calibration circuit that corrects a discontinuous pulse included in the final output signal based on feedback of the final output signal.

20 Claims, 9 Drawing Sheets

(51) Int. Cl.
  *H03K 5/14*          (2014.01)
  *H03K 19/20*         (2006.01)

(56) References Cited

U.S. PATENT DOCUMENTS

| | | |
|---|---|---|
| 10,020,931 B2 | 7/2018 | Abdelmoneum et al. |
| 10,608,652 B2 | 3/2020 | Zerbe et al. |
| 10,998,910 B1 * | 5/2021 | Rosen ..................... H03K 5/13 |
| 2020/0091921 A1 | 3/2020 | Jany et al. |

OTHER PUBLICATIONS

Chung-Ching Lin et al., "Spur Minimization Techniques for Ultra-Low-Power Injection-Locked Transmitters", IEEE Transactions on Circuits and Systems I: Regular Papers, vol. 67, No. 11, 2020, pp. 3643-3655, DOI: 10.1109/TCSI.2020.3010488.

Suneui Park et al., "A 97fsrms-Jitter and 68-Multiplication Factor, 8.16GHz Ring-Oscillator Injection-Locked Clock Multiplier with Power-Gating Injection-Locking and Background Multi-Functional Digital Calibrator", 2022 IEEE International Conference on Solid-State Circuits (ISSCC), 3 pages, DOI: 10.1109/ISSCC42614.2022.9731713.

Y. Lee, M. Kim, T. Seong and J. Choi, "A Low Phase Noise Injection-Locked Programmable Reference Clock Multiplier With a Two-Phase PVT-Calibrator for $\Delta\Sigma$PLLs," in IEEE Transactions on Circuits and Systems I: Regular Papers, vol. 62, No. 3, pp. 635-644, Mar. 2015, doi: 10.1109/TCSI.2014.2370191.

S. Park, S. Yoo, Y. Shin, J. Lee and J. Choi, "A Sub-100 fs-Jitter 8.16-GHz Ring-Oscillator-Based Power-Gating Injection-Locked Clock Multiplier With the Multiplication Factor of 68," in IEEE Journal of Solid-State Circuits, vol. 58, No. 1, pp. 78-89, Jan. 2023, doi: 10.1109/JSSC.2022.3210212.

European Extended Search Report issued Jul. 9, 2024 by the European Patent Office for EP Patent Application No. 24155512.7.

* cited by examiner

FREQUENCY MULTIPLIER BASED ON RING OSCILLATOR USING POWER GATING INJECTION LOCKING

CROSS-REFERENCE TO RELATED APPLICATIONS

This application is based on and claims priority under 35 U.S.C. §119 to Korean Patent Application No. 10-2023-0014456, filed on Feb. 2, 2023, and Korean Patent Application No. 10-2023-0061262, filed on May 11, 2023, in the Korean Intellectual Property Office, the disclosures of each of which being incorporated by reference herein in their entireties.

BACKGROUND

The present disclosure relates to a frequency multiplier, and more specifically, to a frequency multiplier based on a ring oscillator using power gating injection locking.

Recently, the need for clock generators with very low jitter and very high output frequencies has emerged as data bandwidth has increased exponentially in various applications such as high-speed interfaces and high bandwidth memory (HBM). Previously, inductor-capacitor (LC) oscillators were mainly used to achieve low jitter, but a ring-voltage controller oscillator (VCO)-based injection locked frequency multiplier with good noise performance even in a small area is attracting attention as an alternative. Ring oscillators have poor free-running noise performance compared to LC oscillators, so it is difficult to achieve low phase noise, but ultra-low noise performance may be achieved based on the ring oscillators by significantly lowering the free-running noise using an injection locked clock multiplier (ILCM) structure with a much wider bandwidth than a phase locked loop (PLL).

SUMMARY

It is an aspect to provide a frequency multiplier that complementarily turns on a ring oscillator using power gating injection locking.

According to an aspect of one or more embodiments, there is provided a frequency multiplier comprising a first ring oscillator; a second ring oscillator that is turned on complementarily to the first ring oscillator; a combining circuit that combines a first output signal of the first ring oscillator and a second output signal of the second ring oscillator to generate a final output signal; and a calibration circuit that corrects a discontinuous pulse included in the final output signal based on feedback of the final output signal.

According to another aspect of one or more embodiments, there is provided a frequency multiplier for amplifying a reference clock signal by N times, the frequency multiplier comprising a first ring oscillator that is turned on during a first pulse width of a first injection signal to generate a first output signal; a second ring oscillator that is turned on during a second pulse width of a second injection signal alternating with the first injection signal to generate a second output signal; an injection pulse width controller that controls a ratio of the first pulse width to the second pulse width so that a sum of the first pulse width and the second pulse width is the same as a period of the reference clock signal; a combining circuit that combines the first output signal and the second output signal to generate a final output signal; and a calibration circuit that corrects at least one discontinuous pulse included in the final output signal by controlling at least one of a first frequency of the first injection signal, the first pulse width of the first injection signal, a second frequency of the second injection signal, and the second pulse width of the second injection signal.

According to yet another aspect of one or more embodiments, there is provided an electronic device comprising a clock generator that generates a reference clock signal; and a frequency multiplier that amplifies a frequency of the reference clock signal by N times. The frequency multiplier comprises a first ring oscillator that is turned on during a first pulse width of a first injection signal, a second ring oscillator that is turned on during a second pulse width of a second injection signal that does not overlap with the first pulse width, a combining circuit that combines a first output signal of the first ring oscillator and a second output signal of the second ring oscillator to generate a final output signal, and a calibration circuit that adjusts at least one of the first pulse width, the second pulse width, a first frequency, and a second frequency to remove a discontinuous pulse included in the final output signal.

BRIEF DESCRIPTION OF THE DRAWINGS

Various embodiments will be more clearly understood from the following detailed description taken in conjunction with the accompanying drawings, in which.

DETAILED DESCRIPTION

In the injection locked clock multiplier (ILCM), a clean reference signal may be injected into the VCO to correct the shaking phase of the VCO and obtain a clean clock signal. As a result, it is easier to achieve better jitter performance in ILCM structures than in PLL structures. However, most of the ILCM structures have low output frequencies because the multiple N of the ILCM may not be increased as a practical matter. This limitation on the multiple N is because the lock range of the ILCM decreases as the multiple N increases. In order to generate a high output frequency using a low frequency reference clock, N cannot but be inevitably increased. However, in this case, the area of an injection pulse decreases as an output frequency increases, so the amount of injection current that corrects the output phase of an oscillator decreases, and as a result, the lock range decreases. Therefore, there is a need for a method to achieve high jitter performance even at a high frequency multiple N.

Hereinafter, various embodiments will be described in detail with reference to the accompanying drawings.

Figure 1A:
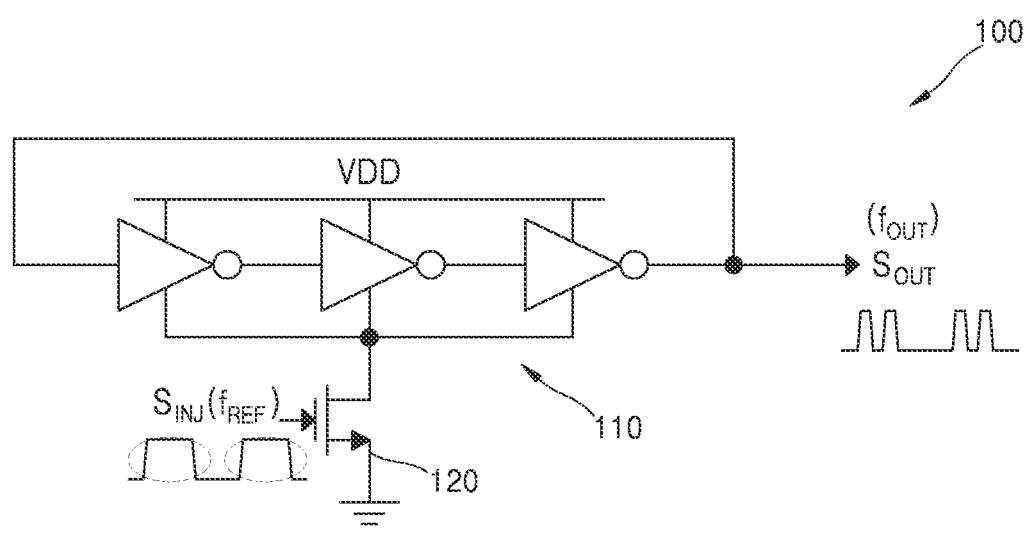
FIG. 1A is a circuit diagram of a power gating (PG)-ring oscillator (RO) according to an embodiment.

FIG. 1A is a circuit diagram of a power gating (PG)-ring oscillator (RO) according to an embodiment. A PG-RO 100 may include a ring oscillator 110 and an injection NMOS transistor 120.

Referring to FIG. 1A, the ring oscillator 110 may include M inverters connected in series. Here, M may be a natural odd number. The injection NMOS transistor 120 may be arranged between the ring oscillator 110 and the ground. The injection signal $S_{INJ}$ of a reference frequency ($f_{REF}$) may be applied through a gate terminal of the injection NMOS transistor 120.

Figure 1B:
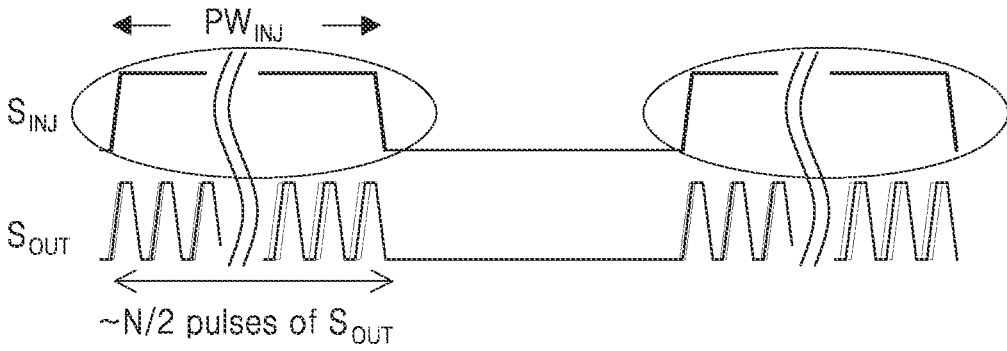
FIG. 1B illustrates a waveform of a PG-RO according to an embodiment.

Referring to FIGS. 1A and 1B, the output signal $S_{OUT}$ may include 0.5 N pulses during the injection pulse width $PW_{INJ}$. Here, N may be a frequency multiple. For example, if the frequency multiple is 60 (i.e., generation of a clock with a frequency 60 times higher than a reference clock), the output signal $S_{OUT}$ of an output frequency ($f_{OUT}$) may contain 30 pulses during the injection pulse width $PW_{INJ}$.

Referring to FIG. 1B, the injection signal $S_{INJ}$ may be "logic high" for half of the period, that is, the injection pulse width $PW_{INJ}$, and may be "logic low" for the other half of the period. Referring to FIG. 1A together with FIG. 1B, since the injection signal $S_{INJ}$ is applied to the gate of the injection NMOS transistor 120, if the injection signal $S_{INJ}$ is "logic low", the injection NMOS transistor 120 is turned off, and accordingly, the ring oscillator 110 may not operate. Thus, it may be seen that there is no output signal $S_{OUT}$ in the period of the injection signal $S_{INJ}$ that is "logic low" except for the injection pulse width $PW_{INJ}$.

Figure 2:
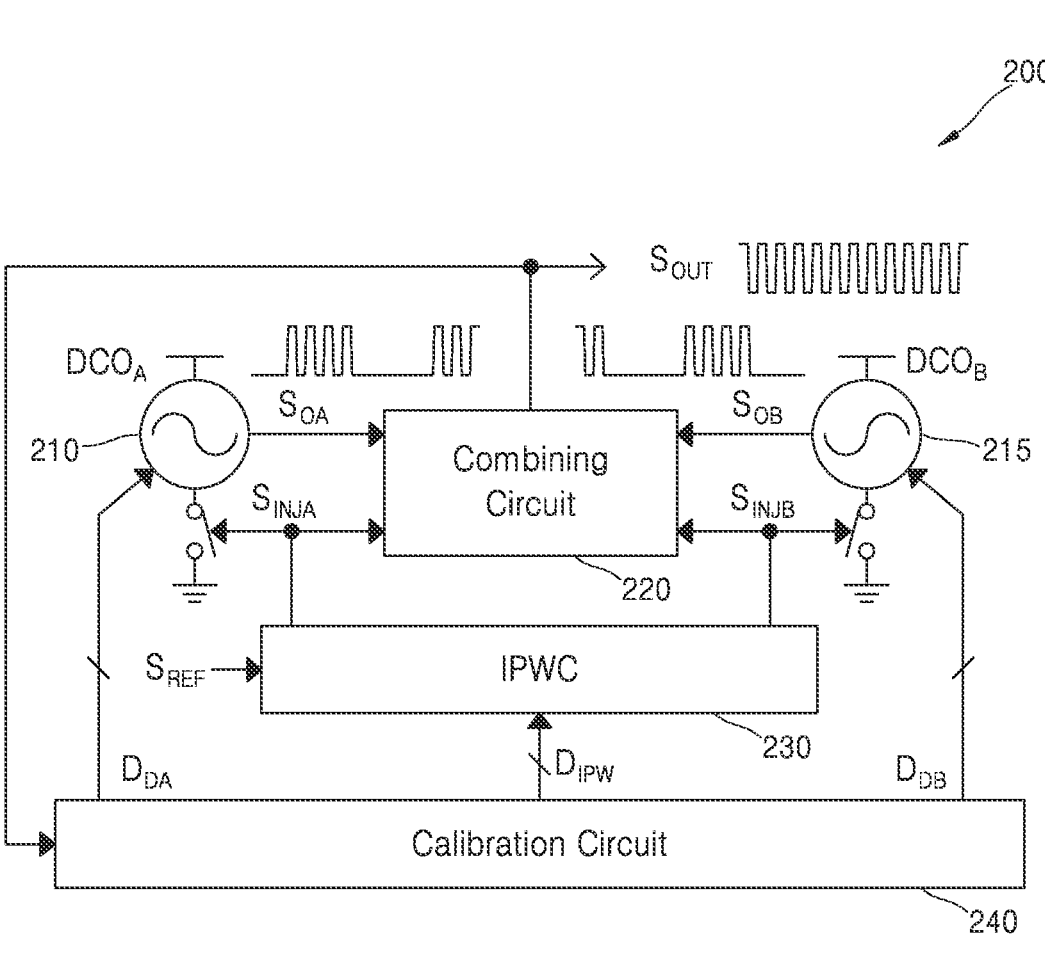
FIG. 2 is a circuit diagram of a power gating (PG)-injection locked clock multiplier (ILCM) according to an embodiment.

FIG. 2 is a circuit diagram of a power gating (PG)-injection locked clock multiplier (ILCM) 200 according to an embodiment.

Referring to FIG. 2, the PG-ILCM 200 may include a first digitally controlled oscillator (DCO) 210, a second DCO 215, a combining circuit 220, an injection pulse width controller (IPWC) 230, and a calibration circuit 240.

Each of the first DCO 210 and the second DCO 215 may correspond to an oscillator controlled by a digital signal. For example, each of the first DCO 210 and the second DCO 215 may correspond to the PG-RO 100 illustrated in FIG. 1A.

According to an embodiment, a first output signal $S_{OA}$ of the first DCO 210 and a second output signal $S_{OB}$ of the second DCO 215 may have a phase difference of 180 degrees from each other. For example, while the first output signal $S_{OA}$ includes 0.5 N pulses, the second output signal $S_{OB}$ may be "logic low". While the second output signal $S_{OB}$ includes 0.5 N pulses, the first output signal $S_{OA}$ may be "logic low". That is, the first injection signal $S_{INJA}$ applied to the first DCO 210 and the second injection signal $S_{INJB}$ applied to the second DCO 215 may be alternately "logic high".

The combining circuit 220 may combine the first output signal $S_{OA}$ and the second output signal $S_{OB}$ to generate a final output signal $S_{OUT}$. As described above, intervals in which the first output signal $S_{OA}$ and the second output signal $S_{OB}$ include 0.5 N pulses may be alternately repeated. The combining circuit 220 may combine the first output signal $S_{OA}$ and the second output signal $S_{OB}$ to generate a final output signal $S_{OUT}$ including N pulses.

The injection pulse width controller 230 may generate injection signals applied to the first DCO 210 and the second DCO 215. For example, the injection pulse width controller

230 may generate and provide the first injection signal $S_{INJA}$ to the first DCO 210 and generate and provide the second injection signal $S_{INJB}$ to the second DCO 215. The injection pulse width controller 230 may adjust the period of the first injection signal $S_{INJA}$ applied to the first DCO 210 and the period of the second injection signal $S_{INJB}$ applied to the second DCO 215 so that the final output signal $S_{OUT}$ includes N pulses. In this case, a ratio of the period of the first injection signal $S_{INJA}$ to the period of the second injection signal $S_{INJB}$ may be 1:1, but the embodiments are not limited thereto. According to various embodiments, the injection pulse width controller 230 may adjust the period of the first injection signal $S_{INJA}$ and the period of the second injection signal $S_{INJB}$ to generate a final output signal $S_{OUT}$ including N pulses, respectively, even if a ratio of the period of the first injection signal $S_{INJA}$ to the period of the second injection signal $S_{INJB}$ is not 1:1.

The calibration circuit 240 may correct a discontinuity included in the final output signal $S_{OUT}$. For example, each of the first DCO 210 and the second DCO 215 may have a unique phase error due to process, voltage, and temperature (PVT) variation in each of the first output signal $S_{OA}$ and the second output signal $S_{OB}$. Accordingly, when the first output signal $S_{OA}$ and the second output signal $S_{OB}$ are simply combined in the combining circuit 220, the signals may be discontinuously combined at each point where the first output signal $S_{OA}$ and the second output signal $S_{OB}$ cross each other (e.g., for every injection pulse width $PW_{INJ}$ of FIG. 1B). The calibration circuit 240 may remove the discontinuity by transmitting control signals to the first DCO 210, the second DCO 215, and the injection pulse width controller 230, respectively. For example, the calibration circuit 240 may correct the frequencies of the first output signal $S_{OA}$ and the second output signal $S_{OB}$ by providing control signals $D_{DA}$ and $D_{DB}$ to the first DCO 210 and the second DCO 215, respectively. The calibration circuit 240 may correct the pulse width of each of the first injection signal $S_{INJA}$ and the second injection signal $S_{INJB}$ by providing a control signal $D_{IPW}$ to the injection pulse width controller 230.

Figure 3:
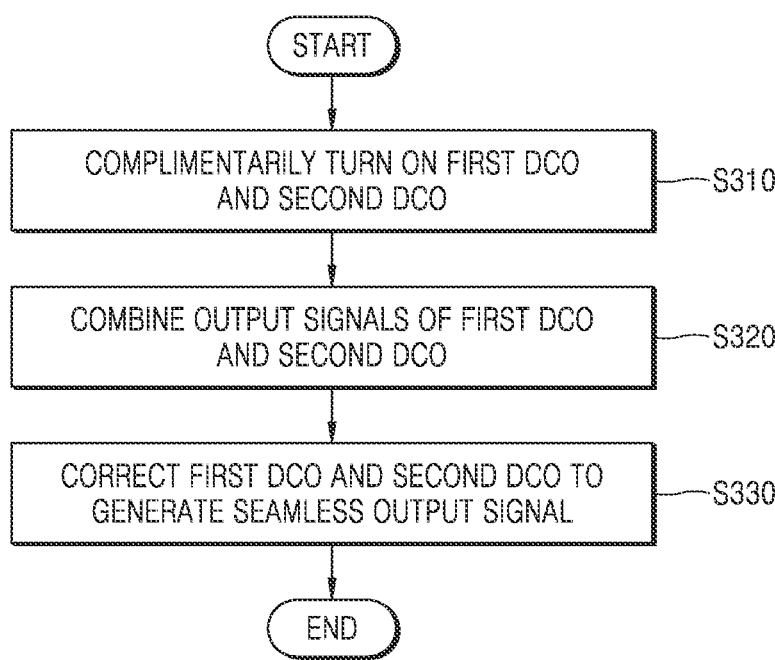
FIG. 3 is a flowchart illustrating a method of operating a PG-ILCM according to an embodiment.

FIG. 3 is a flowchart illustrating a method of operating a PG-ILCM 200 according to an embodiment.

Referring to FIGS. 2 and 3 together, in operation S310, the PG-ILCM 200 may complementarily turn on the first DCO 210 and the second DCO 215. The injection pulse width controller 230 in the PG-ILCM 200 may apply a first injection signal $S_{INJA}$ to the first DCO 210 and a second injection signal $S_{INJB}$ to the second DCO 215, respectively. The first injection signal $S_{INJA}$ and the second injection signal $S_{INJB}$ may be signals of a same period. The first injection signal $S_{INJA}$ and the second injection signal $S_{INJB}$ may have opposite phases to each other. That is, the first injection signal $S_{INJA}$ may be 180 degrees earlier or later than the second injection signal $S_{INJB}$. Therefore, while the first output signal $S_{OA}$ of the first DCO 210 includes pulses, the second output signal $S_{OB}$ of the second DCO 215 may be "logic low", and while the second output signal $S_{OB}$ of the second DCO 215 includes pulses, the first output signal $S_{OA}$ of the first DCO 210 may be "logic low".

In operation S320, the PG-ILCM 200 may combine the output signals of the first DCO 210 and the second DCO 215. The combining circuit 220 in the PG-ILCM 200 may generate a final output signal $S_{OUT}$ by combining the first output signal $S_{OA}$ of the first DCO 210 and the second output signal $S_{OB}$ of the second DCO 215. However, PVT variations of the first DCO 210 and the second DCO 215 may be different, and accordingly, the first output signal $S_{OA}$ and the second output signal $S_{OB}$ may each include a phase error. Therefore, when the combining circuit 220 simply combines the output signals of the first DCO 210 and the second DCO 215, a final output signal $S_{OUT}$ including discontinuous pulses may be generated.

In operation S330, the PG-ILCM 200 may correct the first DCO 210 and the second DCO 215 to generate a seamless final output signal. For example, the calibration circuit 240 in the PG-ILCM 200 may transmit the first control signal $D_{DA}$ to the first DCO 210, the second control signal $D_{DB}$ to the second DCO 215, and the fourth control signal $D_{IPW}$ to the injection pulse width controller 230. The calibration circuit 240 may adjust the first control signal $D_{DA}$ and the second control signal $D_{DB}$ such that the period $T_{DCOA}$ of the first output signal $S_{OA}$ and the period $T_{DCOB}$ of the second output signal $S_{OB}$ are a value obtained by dividing the pulse width $PW_{INJA}$ of the first output signal $S_{OA}$ by an arbitrary natural number $N_A$, and a value obtained by dividing the pulse width $PW_{INJB}$ of the second output signal $S_{OB}$ by an arbitrary natural number $N_B$, respectively.

Figure 4:
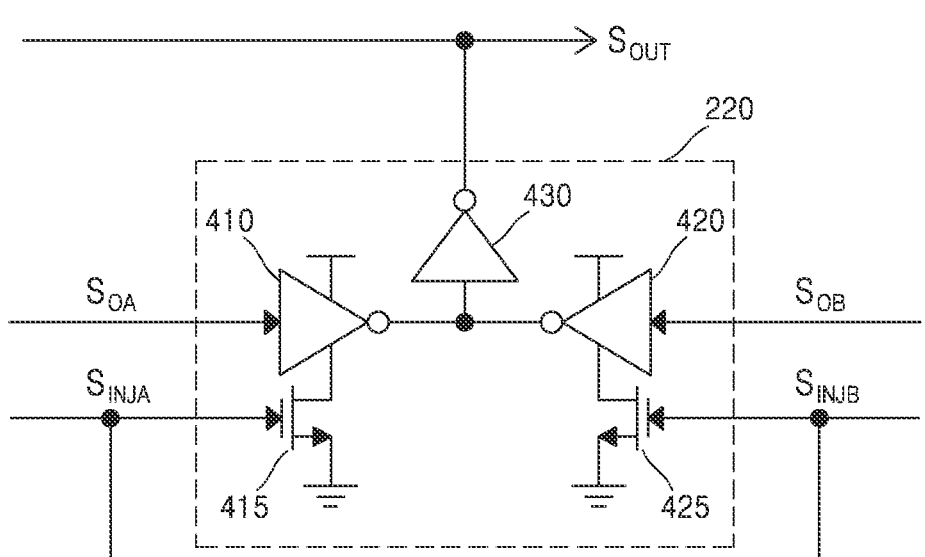
FIG. 4 illustrates a combining circuit according to an embodiment.

FIG. 4 illustrates a combining circuit 220 according to an embodiment.

Referring to FIG. 4, the combining circuit 220 may include a first inverter 410, a second inverter 420, and a third inverter 430.

The first inverter 410 may receive the first output signal $S_{OA}$ of the first DCO 210 as an input signal. The first inverter 410 may be further connected to the first NMOS transistor 415 so as to be turned on only in a section in which the first output signal $S_{OA}$ includes pulses. For example, the first NMOS transistor 415 may be arranged between the first inverter 410 and the ground. The first injection signal $S_{INJA}$ may be applied to the gate terminal of the first NMOS transistor 415 and may turn on the first NMOS transistor 415 in the section in which the first output signal $S_{OA}$ includes pulses. The first output signal $S_{OA}$ inverted through the first inverter 410 may be inverted again through the third inverter 430 to be output as a portion of the final output signal $S_{OUT}$.

The second inverter 420 may receive the second output signal $S_{OB}$ of the second DCO 215 as an input signal. The second inverter 420 may be further connected to the second NMOS transistor 425 so as to be turned on only in the section in which the second output signal $S_{OB}$ includes pulses. For example, the second NMOS transistor 425 may be arranged between the second inverter 420 and the ground. The second injection signal $S_{INJB}$ is applied to the gate terminal of the second NMOS transistor 425 and may turn on the second NMOS transistor 425 in the section in which the second output signal $S_{OB}$ includes pulses. The second output signal $S_{OB}$ inverted through the second inverter 420 may be inverted again through the third inverter 430 to be output as a portion of the final output signal $S_{OUT}$. That is, since the first output signal $S_{OA}$ and the second output signal $S_{OB}$ alternately include pulses, the final output signal $S_{OUT}$ output through the third inverter 430 may be a signal frequency-multiplied by N times.

Figure 5:
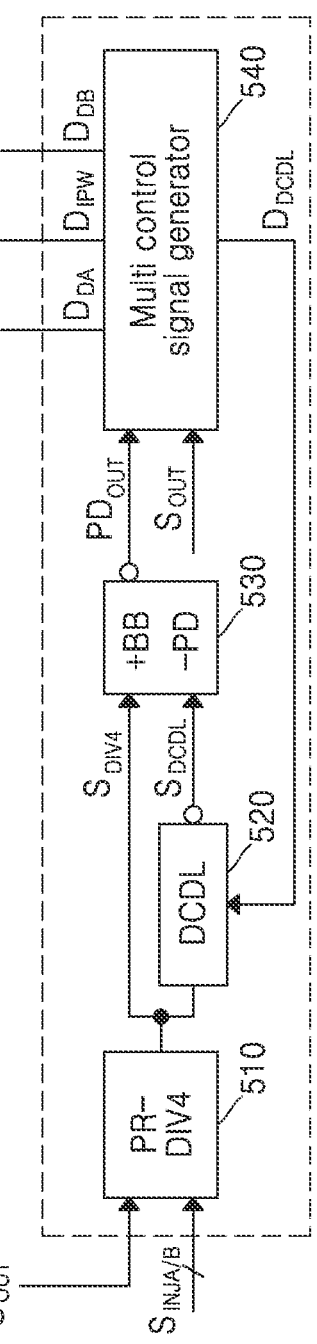
FIG. 5 illustrates a calibration circuit according to an embodiment.

FIG. 5 illustrates a calibration circuit 240 according to an embodiment.

Referring to FIG. 5, the calibration circuit 240 may include a phase-rotation divider (PR-DIV4) 510, a digitally controlled delay line (DCDL) 520, a bang bang phase detector (BBPD) 530, and a multi control signal generator 540.

The PR-DIV4 510 may lower the operating frequency of the final output signal $S_{OUT}$ frequency-multiplied by N times to generate a reduced frequency signal $S_{DIV4}$. For example, in an embodiment, the PR-DIV4 510 may lower the operating frequency of the final output signal $S_{OUT}$ by ¼. By lowering the operating frequency of the final output signal $S_{OUT}$ through the PR-DIV4 510, the DCDL 520 and the BBPD 530 of the next stage may operate at low operating frequencies, which may reduce power consumption.

The DCDL 520 may delay the reduced frequency signal $S_{DIV4}$ based on a set offset value to generate a delayed signal $S_{DCDL}$ and output the delayed signal $S_{DCDL}$ to the BBPD 530. The BBPD 530 may compare the phase of the delayed signal $S_{DCDL}$ delayed by the DCDL 520 with the phase of the reduced frequency signal $S_{DIV4}$. The BBPD 530 may provide an output signal $PD_{OUT}$ to the multi control signal generator 540 indicating the result of the comparison between the phase of the delayed signal $S_{DCDL}$ and the phase of the reduced frequency signal $S_{DIV4}$.

The multi control signal generator 540 may provide control signals to the first DCO 210, the second DCO 215, and the injection pulse width controller 230, respectively, on the basis of the output signal $PD_{OUT}$ indicating a result of a phase comparison indicating whether the phase of any one of the delayed signal $S_{DCDL}$ and the reduced frequency signal $S_{DIV4}$ is earlier.

According to an embodiment, the multi control signal generator 540 may provide the first control signal $D_{DA}$ to the first DCO 210. The first control signal $D_{DA}$ may be a signal for controlling a frequency of the first output signal $S_{OA}$. For example, when the output signal $PD_{OUT}$ of the BBPD 530 is zero at the rising edge of the fourth pulse of the second output signal $S_{OB}$, the multi control signal generator 540 may generate the first control signal $D_{DA}$ to reduce the period of the first output signal $S_{OA}$. That is, when the phase of the delayed signal $S_{DCDL}$ is later in phase than the reduced frequency signal $S_{DIV4}$, the first control signal $D_{DA}$ having the reduced value may be generated. The multi control signal generator 540 may reduce a period of the first output signal $S_{OA}$ by reducing a value of the first control signal $D_{DA}$.

According to an embodiment, the multi control signal generator 540 may provide the second control signal $D_{DB}$ to the second DCO 215. The second control signal $D_{DB}$ may be a signal for controlling a frequency of the second output signal $S_{OB}$. For example, when the output signal $PD_{OUT}$ of the BBPD 530 is zero at the rising edge of the fourth pulse of the first output signal $S_{OA}$, the multi control signal generator 540 may generate the second control signal $D_{DB}$ to reduce the period of the second output signal $S_{OB}$. That is, when the phase of the delayed signal $S_{DCDL}$ is later in phase than the reduced frequency signal $S_{DIV4}$, the second control signal $D_{DB}$ having the reduced value may be generated. The multi control signal generator 540 may reduce a period of the second output signal $S_{OB}$ by reducing a value of the second control signal $D_{DB}$.

According to an embodiment, the multi control signal generator 540 may provide a third control signal $D_{DCDL}$ to the DCDL 520. The third control signal $D_{DCDL}$ may be a signal for controlling how much to delay the reduced frequency signal $S_{DIV4}$ output by the PR-DIV4 510. For example, when the output signal $PD_{OUT}$ of the BBPD 530 is zero at the rising edge of the last pulse of the first output signal $S_{OA}$, the multi control signal generator 540 may generate the third control signal $D_{DCDL}$ to reduce the delay time by the DCDL 520. The period of the delayed signal $S_{DCDL}$ may be reduced by providing a third control signal $D_{DCDL}$ of a small value to the DCDL 520. The period of the delayed signal $S_{DCDL}$ may be reduced until the period of the delayed signal $S_{DCDL}$ becomes twice the period of the first output signal $S_{OA}$.

According to an embodiment, the multi control signal generator 540 may provide the fourth control signal $D_{IPW}$ to the injection pulse width controller 230. The fourth control signal $D_{IPW}$ may be a signal for adjusting both the pulse width $PW_{INJA}$ of the first output signal $S_{OA}$ and the pulse width $PW_{INJB}$ of the second output signal $S_{OB}$. For example, at the rising edge of the last pulse of the second output signal $S_{OB}$, the multi control signal generator 540 may generate the fourth control signal $D_{IPW}$ so that a sum of the pulse width $PW_{INJA}$ of the first output signal $S_{OA}$ and the pulse width $PW_{INJB}$ of the second output signal $S_{OB}$ is equal to a reference clock cycle when the output signal $PD_{OUT}$ of the BBPD 530 is one. When the output signal $PD_{OUT}$ of the BBPD 530 is one, the fourth control signal $D_{IPW}$ may instruct the injection pulse width controller 230 to increase the pulse width $PW_{INJA}$ of the first output signal $S_{OA}$ and decrease the pulse width $PW_{INJB}$ of the second output signal $S_{OB}$.

Figure 6:
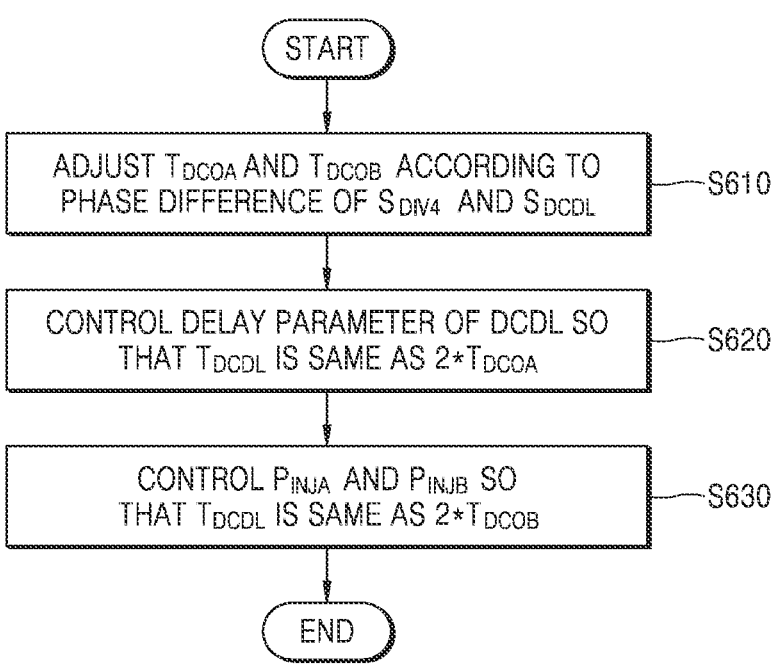
FIG. 6 is a flowchart illustrating a method of operating a calibration circuit, according to an embodiment.

FIG. 6 is a flowchart illustrating a method of operating a calibration circuit 240, according to an embodiment.

Referring to FIG. 6, in operation S610, the calibration circuit 240 may adjust a period $T_{DCOA}$ of the first output signal $S_{OA}$ and a period $T_{DCOB}$ of the second output signal $S_{OB}$ according to a phase difference between the reduced frequency signal $S_{DIV4}$ of the PR-DIV4 510 and the delayed signal $S_{DCDL}$ of the DCDL 520. For example, when the period $T_{DCOA}$ of the first output signal $S_{OA}$ does not satisfy a value obtained by dividing the pulse width $PW_{INJA}$ of the first output signal $S_{OA}$ by any natural number $N_4$, a phase difference may appear between the reduced frequency signal $S_{DIV4}$ of the PR-DIV4 510 and the delayed signal $S_{DCDL}$ of the DCDL 520. This phase difference is because the reduced frequency signal $S_{DIV4}$ of the PR-DIV4 510 is just injected and generated from the second pulse of the clean second output signal $S_{OB}$, while the delayed signal $S_{DCDL}$ of the DCDL 520 is generated from the last pulse of the first output signal $S_{OA}$ in which the phase error of the first output signal $S_{OA}$ is accumulated by the period of $N_A$ times. Therefore, when the output signal $PD_{OUT}$ of the BBPD 530 is zero at the rising edge of the second pulse of the second output signal $S_{OB}$, the calibration circuit 240 may generate the first control signal $D_{DA}$ to reduce the period $T_{DCOA}$ of the first output signal $S_{OA}$. When the output signal $PD_{OUT}$ of the BBPD 530 is zero at the rising edge of the second pulse of the first output signal $S_{OA}$, the calibration circuit 240 may generate the second control signal $D_{DB}$ to reduce the period $T_{DCOB}$ of the second output signal $S_{OB}$.

In operation S620, the calibration circuit 240 may control a delay parameter of the DCDL 520 so that the period of the delayed signal $S_{DCDL}$ of the DCDL 520 is twice the period $T_{DCOA}$ of the first output signal $S_{OA}$. For example, when the output signal $PD_{OUT}$ of the BBPD 530 is zero at the rising edge of the last pulse of the first output signal $S_{OA}$, the multi control signal generator 540 of the calibration circuit 240 may generate a third control signal $D_{DCDL}$ that instructs the reduction of the period $T_{DCDL}$ of the delayed signal $S_{DCDL}$ of the DCDL 520.

In operation S630, the calibration circuit 240 may adjust the pulse width $PW_{INJA}$ of the first output signal $S_{OA}$ and the pulse width $PW_{INJB}$ of the second output signal $S_{OB}$ so that the period $T_{DCDL}$ of the output signal $S_{DCDL}$ of the DCDL 520 is twice the period $T_{DCOB}$ of the second output signal $S_{OB}$. This operation allows the calibration circuit 240 to indirectly compare the period $T_{DCOA}$ of the first output signal $S_{OA}$ with the period $T_{DCOB}$ of the second output signal $S_{OB}$ by means of the period $T_{DCDL}$ of the delayed signal $S_{DCDL}$ of the DCDL 520.

Figure 7:
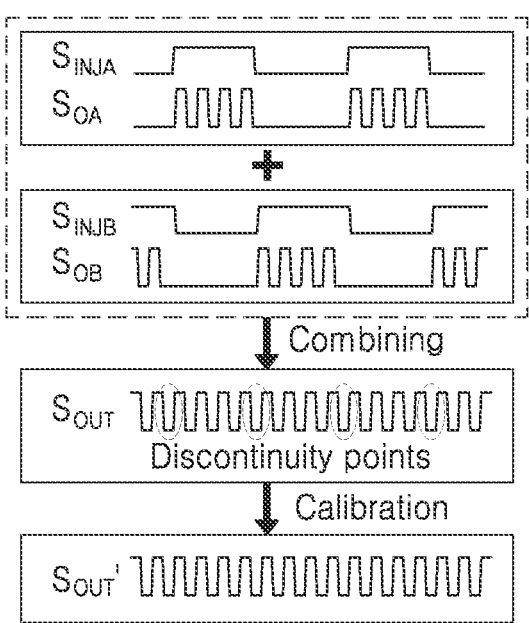
FIG. 7 illustrates waveforms according to an embodiment.

FIG. 7 illustrates waveforms according to an embodiment.

Referring to FIG. 7, the PG-ILCM 200 may complementarily turn on the first DCO 210 and the second DCO 215. For example, the first DCO 210 may generate the first output signal $S_{OA}$ including 0.5 N pulses by the first injection signal $S_{INJA}$. Pulses of the first output signal $S_{OA}$ may be generated only during a section in which the first injection signal $S_{INJA}$ is "logic high". The second DCO 215 may generate the second output signal $S_{OB}$ including 0.5 N pulses by the second injection signal $S_{INJB}$. The pulses of the second output signal $S_{OB}$ may be generated only during a section in which the second injection signal $S_{INJB}$ is "logic high". As shown in FIG. 7, since the first injection signal $S_{INJA}$ and the second injection signal $S_{INJB}$ have phase difference of 180 degrees, pulses of the first output signal $S_{OA}$ and pulses of the second output signal $S_{OB}$ may be alternately generated.

The PG-ILCM 200 may combine the first output signal $S_{OA}$ and the second output signal $S_{OB}$ through the combining circuit 220. Since the "logic high" sections of the first injection signal $S_{INJA}$ and the second injection signal $S_{INJB}$ do not overlap each other, the final output signal $S_{OUT}$ may include N pulses. However, as illustrated in FIG. 7, it can be seen that the output signal $S_{OUT}$ includes uneven error pulses such as pulses undergoing transitions to logic low during the rising edges rather than normal pulses, including phase errors. Therefore, when the combining circuit 220 simply combines the first output signal $S_{OA}$ and the second output signal $S_{OB}$, the output signal $S_{OUT}$ may include discontinuous pulses.

Therefore, the calibration circuit 240 controls the period $T_{DCOA}$ of the first output signal $S_{OA}$ and the period $T_{DCOB}$ of the second output signal $S_{OB}$ through phase comparison between pulses with accumulated phase errors and pulses without phase errors, and controls the pulse width $PW_{INJA}$ of the first output signal $S_{OA}$ and the pulse width $PW_{INJB}$ of the second output signal $S_{OB}$ through the period $T_{DCDL}$ of the delayed signal $S_{DCDL}$ of the DCDL 520, to thus generate a final output signal $S_{OUT}'$ including seamless pulses.

Figure 8:
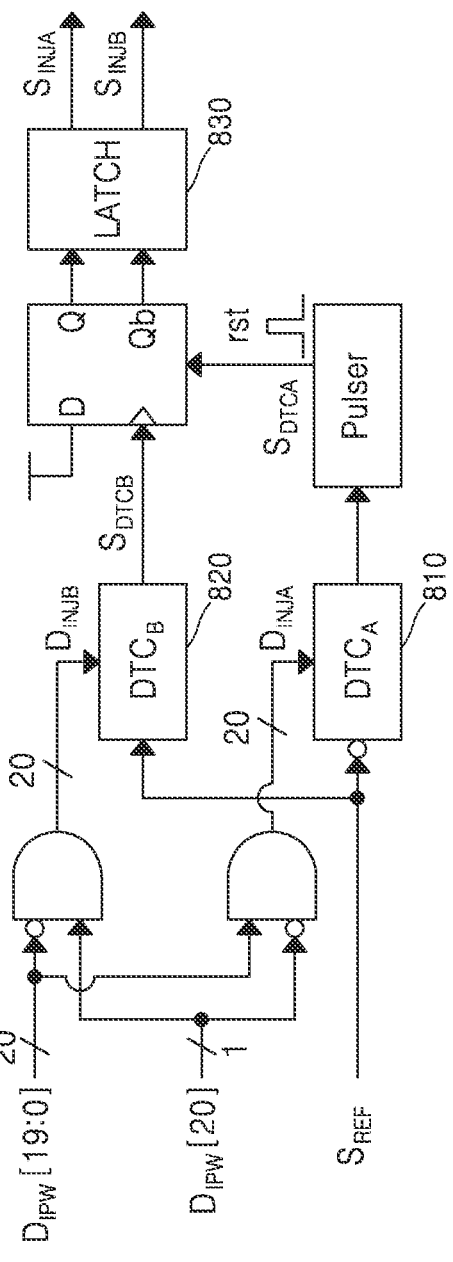
FIG. 8 is a circuit diagram of an injection pulse width controller according to an embodiment.

FIG. 8 is a circuit diagram of an injection pulse width controller 230 according to an embodiment.

Referring to FIG. 8, the injection pulse width controller 230 may receive a control signal from the calibration circuit 240. For example, the injection pulse width controller 230 may receive a fourth control signal $D_{IPW}$ from the calibration circuit 240, the fourth control signal $D_{IPW}$ instructing the injection pulse width controller 230 to control the pulse width $PW_{INJA}$ of the first output signal $S_{OA}$ and the pulse width $PW_{INJB}$ of the second output signal $S_{OB}$. In some embodiments, the fourth control signal $D_{IPW}$ may be a 21-bit control signal.

According to an embodiment, the most significant bit MSB of the fourth control signal $D_{IPW}$ may be a bit for indicating whether to increase the pulse width $PW_{INJA}$ of the first output signal $S_{OA}$ or the pulse width $PW_{INJB}$ of the second output signal $S_{OB}$. For example, when the most significant bit of the fourth control signal $D_{IPW}$ is "logic low", the pulse width $PW_{INJA}$ of the first output signal $S_{OA}$ may be controlled to increase. When the most significant bit of the fourth control signal $D_{IPW}$ is "logic high", the pulse width $P_{WINJB}$ of the second output signal $S_{OB}$ may be controlled to increase.

The injection pulse width controller 230 may include a first digital to time converter (DTC$_A$) 810, a second digital to time converter (DTC$_B$) 820, and a latch 830. When the first DTC 810 adjusts the pulse width $PW_{INJA}$ of the first output signal $S_{OA}$, the first DTC 810 may convert the remaining 20 bits except for the most significant bit MSB from the fourth control signal $D_{IPW}$ to a time value indicating how long the falling edge of reference clock $S_{REF}$ would be delayed. When the second DTC 820 adjusts the pulse width $PW_{INJB}$ of the second output signal $S_{OB}$, the second DTC 820 may convert the remaining 20 bits except for the most significant bit MSB from the fourth control signal $D_{IPW}$ to a time value indicating how long the rising edge of reference clock $S_{REF}$ would be delayed. The latch 830 may output the first injection signal $S_{INJA}$ and the second injection signal $S_{INJB}$ according to the reference clock $S_{REF}$ in which the falling edge is delayed by the time value indicated by the first DTC 810 or the rising edge is delayed by the time value indicated by the second DTC 820.

Figure 9A:
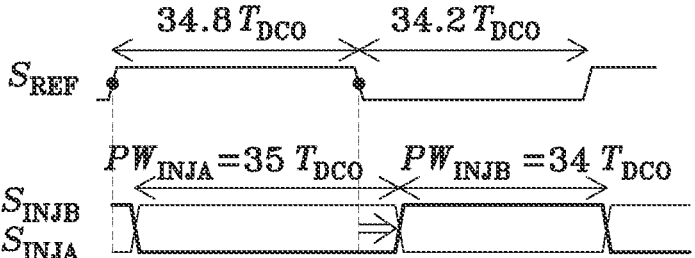
FIG. 9A illustrates an example of bidirectional pulse width adjustment according to an embodiment.

FIG. 9A illustrates an example of bidirectional pulse width adjustment according to an embodiment.

Referring to FIG. 9A, according to an embodiment, the duty cycle of the final output signal $S_{OUT}$ may be 50.9%. That is, when the frequency multiple N=69, the pulse width $PW_{INJA}$ of the first output signal $S_{OA}$ may be 34.8 $T_{DCO}$, and the pulse width $PW_{INJB}$ of the second output signal $S_{OB}$ may be 34.2 $T_{DCO}$. In order to make the pulse width $PW_{INJA}$ of the first output signal $S_{OA}$ and the pulse width $PW_{INJB}$ of the second output signal $S_{OB}$ at the same time as an integer multiple of the period $T_{DCO}$ of the reference clock $S_{REF}$, the smallest adjustment may be implemented by reducing the pulse width $PW_{INJB}$ of the second output signal $S_{OB}$ by 0.2 $T_{DCO}$, and may be implemented by increasing the pulse width $PW_{INJA}$ of the first output signal $S_{OA}$ by 0.2 $T_{DCO}$. Therefore, the calibration circuit 240 may provide the injection pulse width controller 230 with a fourth control signal $D_{IPW}$ including the most significant bit of the "logic low" and 20 bits representing the size of 0.2 $T_{DCO}$. The injection pulse width controller 230 may delay the falling edge of the reference clock $S_{REF}$ by 0.2 $T_{DCO}$ based on the most significant bit of the "logic low" in the fourth control signal $D_{IPW}$, and accordingly, the pulse width $PW_{INJA}$ of the first output signal $S_{OA}$ may be adjusted to 35 $T_{DCO}$ and the pulse width $PW_{INJB}$ of the second output signal $S_{OB}$ may be adjusted to 34 $T_{DCO}$.

Figure 9B:
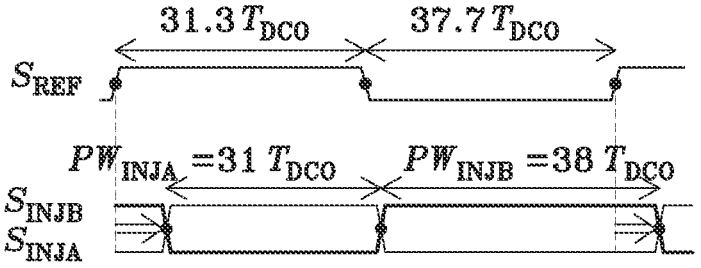
FIG. 9B illustrates another example of bidirectional pulse width adjustment according to an embodiment.

FIG. 9B illustrates an example of bidirectional pulse width adjustment according to an embodiment.

Referring to FIG. 9B, according to an embodiment, the duty cycle of the final output signal $S_{OUT}$ may be 45.3%. That is, when the frequency multiple N=69, the pulse width $PW_{INJA}$ of the first output signal $S_{OA}$ may be 31.3 $T_{DCO}$, and the pulse width $PW_{INJB}$ of the second output signal $S_{OB}$ may be 37.7 $T_{DCO}$. In order to make the pulse width $PW_{INJA}$ of the first output signal $S_{OA}$ and the pulse width $PW_{INJB}$ of the second output signal $S_{OB}$ at the same time as an integer multiple of the period $T_{DCO}$ of the reference clock $S_{REF}$, the smallest adjustment may be implemented by increasing the pulse width $PW_{INJB}$ of the second output signal $S_{OB}$ by 0.3 $T_{DCO}$, and may be implemented by reducing the pulse width $PW_{INJA}$ of the first output signal $S_{OA}$ by 0.3 $T_{DCO}$. Therefore, the calibration circuit 240 may provide the injection pulse width controller 230 with a fourth control signal $D_{IPW}$ including the most significant bit of the "logic high" and 20 bits representing the size of 0.3 $T_{DCO}$. The injection pulse width controller 230 may delay the falling edge of the reference clock $S_{REF}$ by 0.3 $T_{DCO}$ based on the most significant bit of the "logic high" in the fourth control signal $D_{IPW}$, and accordingly, the pulse width $PW_{INJA}$ of the first output signal $S_{OA}$ may be adjusted to 31 $T_{DCO}$ and the pulse width $PW_{INJB}$ of the second output signal $S_{OB}$ may be adjusted to 38 $T_{DCO}$.

While various embodiments have been particularly shown and described with reference to the drawings, it will be understood that various changes in form and details may be made therein without departing from the spirit and scope of the following claims.

What is claimed is:

1. A frequency multiplier comprising:
a first ring oscillator;
a second ring oscillator that is turned on complementarily to the first ring oscillator;
a combining circuit that combines a first output signal of the first ring oscillator and a second output signal of the second ring oscillator to generate a final output signal; and
a calibration circuit that corrects a discontinuous pulse included in the final output signal by providing control signals to the first ring oscillator and second ring oscillator based on the final output signal.

2. The frequency multiplier of claim 1, further comprising an injection pulse width controller that injects a first injection signal into the first ring oscillator and injects a second injection signal into the second ring oscillator,
wherein the first injection signal and the second injection signal are alternately changed to logic high.

3. The frequency multiplier of claim 2, wherein the combining circuit comprises:
a first inverter that is turned on according to the first injection signal and inverts the first output signal of the first ring oscillator;
a second inverter that is turned on according to the second injection signal and inverts the second output signal of the second ring oscillator; and
a third inverter connected to an output end of the first inverter and the second inverter, the third inverter inverting the inverted first output signal to output the first output signal during a logic high of the first injection signal, and generating the final output signal by inverting the inverted second output signal to output the second output signal during a logic high of the second injection signal.

4. The frequency multiplier of claim 2, wherein the calibration circuit comprises a phase-rotation divider, a digital control delay line, a phase detector, and a multi control signal generator.

5. The frequency multiplier of claim 4, wherein the phase-rotation divider reduces an operating frequency of the final output signal by ¼ to generate a reduced frequency signal, and outputs the reduced frequency signal.

6. The frequency multiplier of claim 5, wherein the digital control delay line delays, by a predefined value, the reduced frequency signal to generate a delayed signal, and outputs the delayed signal.

7. The frequency multiplier of claim 6, wherein the phase detector detects a phase difference between the reduced frequency signal and the delayed signal.

8. The frequency multiplier of claim 7, wherein the multi control signal generator generates:
a first control signal provided to the first ring oscillator to adjust a frequency of the first output signal;
a second control signal provided to the second ring oscillator to adjust a frequency of the second output signal;
a third control signal provided to the digital control delay line to adjust the predefined value; and
a fourth control signal provided to the injection pulse width controller to adjust a first pulse width of the first injection signal and a second pulse width of the second injection signal.

9. A frequency multiplier for amplifying a reference clock signal by N times, the frequency multiplier comprising:

a first ring oscillator that is turned on during a first pulse width of a first injection signal to generate a first output signal;

a second ring oscillator that is turned on during a second pulse width of a second injection signal alternating with the first injection signal to generate a second output signal;

an injection pulse width controller that controls a ratio of the first pulse width to the second pulse width so that a sum of the first pulse width and the second pulse width is the same as a period of the reference clock signal;

a combining circuit that combines the first output signal and the second output signal to generate a final output signal; and a calibration circuit that corrects at least one discontinuous pulse included in the final output signal by providing control signals to the first ring oscillator and the second ring oscillator based on the final output signal to control at least one of a first frequency of the first injection signal, the first pulse width of the first injection signal, a second frequency of the second injection signal, and the second pulse width of the second injection signal.

10. The frequency multiplier of claim 9, wherein the combining circuit comprises:

a first inverter that inverts the first output signal of the first ring oscillator when turned on according to the first injection signal;

a second inverter that inverts the second output signal of the second ring oscillator when turned on according to the second injection signal; and a third inverter connected to an output end of each of the first inverter and the second inverter, the third inverter inverting the inverted first output signal to output the first output signal during the first pulse width of the first injection signal, and generating the final output signal by inverting the inverted second output signal to output the second output signal during the second pulse width of the second injection signal.

11. The frequency multiplier of claim 9, wherein the calibration circuit comprises a phase-rotation divider, a digital control delay line, a phase detector, and a multi control signal generator.

12. The frequency multiplier of claim 11, wherein the phase-rotation divider reduces an operating frequency of the final output signal by ¼ to generate a reduced frequency signal, and outputs the reduced frequency signal.

13. The frequency multiplier of claim 12, wherein the digital control delay line delays, by a predefined value, the reduced frequency signal to generate a delayed signal, and outputs the delayed signal.

14. The frequency multiplier of claim 13, wherein the phase detector detects a phase difference between the reduced frequency signal and the delayed signal.

15. The frequency multiplier of claim 14, wherein the multi control signal generator generates:

a first control signal provided to the first ring oscillator to adjust a frequency of the first output signal;

a second control signal provided to the second ring oscillator to adjust a frequency of the second output signal;

a third control signal provided to the digital control delay line to adjust the predefined value; and a fourth control signal provided to the injection pulse width controller to adjust the first pulse width of the first injection signal and the second pulse width of the second injection signal.

16. An electronic device comprising:

a clock generator that generates a reference clock signal; and a frequency multiplier that amplifies a frequency of the reference clock signal by N times, wherein the frequency multiplier comprises:

a first ring oscillator that is turned on during a first pulse width of a first injection signal, a second ring oscillator that is turned on during a second pulse width of a second injection signal that does not overlap with the first pulse width, a combining circuit that combines a first output signal of the first ring oscillator and a second output signal of the second ring oscillator to generate a final output signal, and a calibration circuit that provides control signals to the first ring oscillator and the second ring oscillator based on the final output signal to adjust at least one of the first pulse width, the second pulse width, a first frequency, and a second frequency to remove a discontinuous pulse included in the final output signal.

17. The electronic device of claim 16, wherein a sum of the first pulse width and the second pulse width is the same as a period of the reference clock signal.

18. The electronic device of claim 16, wherein the calibration circuit comprises:

a phase-rotation divider, a digital control delay line, a phase detector, and a multi control signal generator.

19. The electronic device of claim 18, wherein:

the phase-rotation divider reduces an operating frequency of the final output signal by ¼ to generate a reduced frequency signal, and outputs the reduced frequency signal, the digital control delay line delays, by a predefined value, the reduced frequency signal to generate a delayed signal, and outputs the delayed signal, the phase detector detects a phase difference between the reduced frequency signal and the delayed signal, and the multi control signal generator generates a first control signal provided to the first ring oscillator to adjust a frequency of the first output signal, a second control signal provided to the second ring oscillator to adjust a frequency of the second output signal, a third control signal provided to the digital control delay line to adjust the predefined value, and a fourth control signal to adjust the first pulse width of the first injection signal and the second pulse width of the second injection signal.

20. The electronic device of claim 19, wherein the calibration circuit is configured to:

adjust a first period of a plurality of pulses included in the first output signal to be equal to a value obtained by dividing the first pulse width of the first injection signal by a first value, adjust a second period of a plurality of pulses included in the second output signal to be equal to a value obtained by dividing the second pulse width of the second injection signal by a second value, and adjust a period of the delayed signal to be equal to twice the first period, wherein a sum of the first value and the second value is the same as a value of N.

* * * * *